(12) United States Patent
Both et al.

(10) Patent No.: US 8,604,792 B2
(45) Date of Patent: Dec. 10, 2013

(54) CIRCULATOR

(75) Inventors: Markus Both, Hallstadt (DE); Franz Eiermann, Rattelsdorf-Ebing (DE); Klaus Huber, Effeltrich (DE); Georg Rauh, Zirndorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/546,088

(22) Filed: Jul. 11, 2012

(65) Prior Publication Data

US 2013/0278266 A1    Oct. 24, 2013

Related U.S. Application Data

(63) Continuation of application No. 12/593,629, filed on Sep. 29, 2009, now abandoned.

(30) Foreign Application Priority Data

Mar. 30, 2007 (DE) .......................... 10 2007 015 544

(51) Int. Cl.
*G01V 3/00*  (2006.01)
(52) U.S. Cl.
USPC .......................................... 324/318; 324/322
(58) Field of Classification Search
USPC ........................................ 324/318, 322, 300
See application file for complete search history.

(56) References Cited

U.S. PATENT DOCUMENTS

| | | | |
|---|---|---|---|
| 3,355,680 A | 11/1967 | Saltzman et al. | |
| 4,034,377 A | 7/1977 | Knox et al. | |
| 4,050,038 A | 9/1977 | Noguchi et al. | |
| 5,128,635 A | 7/1992 | Vaughan et al. | |
| 6,097,261 A | 8/2000 | Wendel | |
| 6,107,895 A | 8/2000 | Butland et al. | |
| 6,118,352 A | 9/2000 | Wendel | |
| 6,317,010 B1 | 11/2001 | Butland et al. | |
| 6,518,851 B2 * | 2/2003 | Kocharyan | 333/1.1 |
| 7,615,999 B2 | 11/2009 | Graesslin et al. | |
| 7,642,782 B2 | 1/2010 | Vernickel et al. | |
| 7,808,243 B2 * | 10/2010 | Feld et al. | 324/318 |
| 2002/0039054 A1 | 4/2002 | Kocharyan | |
| 2004/0145424 A1 | 7/2004 | Jocher | |

FOREIGN PATENT DOCUMENTS

| | | |
|---|---|---|
| CN | 1089178 | 7/1994 |
| DE | 42 04 299 | 8/1993 |
| EP | 0 117 879 | 9/1984 |
| WO | WO 2007/101741 | 9/2007 |

* cited by examiner

*Primary Examiner* — Louis Arana
(74) *Attorney, Agent, or Firm* — Schiff Hardin LLP

(57) ABSTRACT

A circulator suitable for use in an external field, particularly of a magnetic resonance apparatus, has a planar ferrite structure. Instead of a permanent magnet, a field conducting device is provided that is designed to strengthen or weaken an external field, and/or at least one electromagnet is provided for generating an operating field. The operating field proceeds perpendicularly through the ferrite structure.

14 Claims, 3 Drawing Sheets

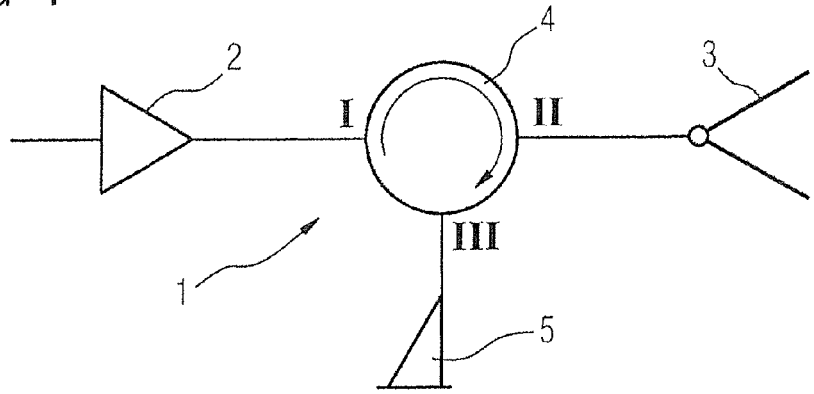
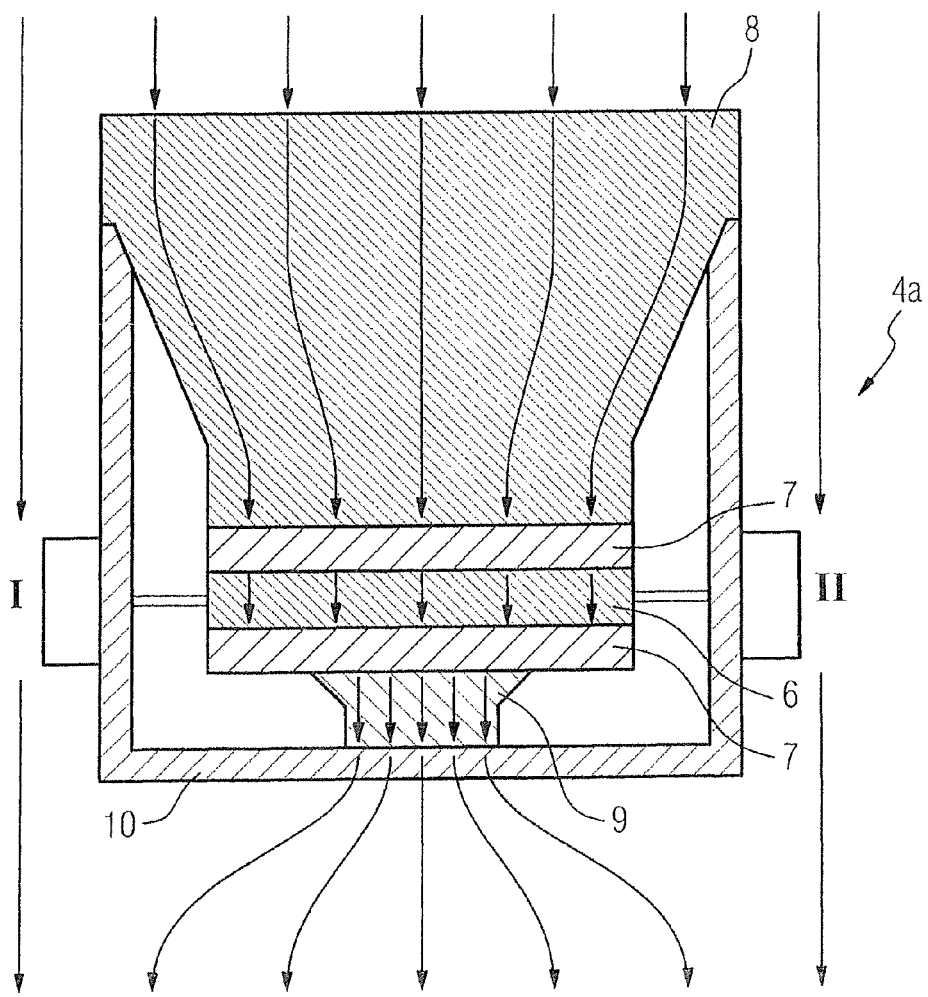

CIRCULATOR

RELATED APPLICATION

The present application is a continuation of parent application Ser. No. 12/593,629, filed Sep. 29, 2009 (now abandoned).

BACKGROUND OF THE INVENTION

1. Field of the Invention

The invention concerns a circulator suitable for use in an external magnetic field, in particular of a magnetic resonance apparatus, of the type having a flat ferrite structure.

2. Description of the Prior Art

To excite nuclei in magnetic resonance and to acquire the response signals, magnetic resonance apparatuses employ radio-frequency antennas, in particular whole-body antennas that are arranged inside the magnet and must be activated with correspondingly high powers in the kilowatt range to emit the excitation signal. At least one amplifier is therefore provided that feeds a signal to the input of the radio-frequency antenna. Instead of a single amplifier for the entire antenna, it has been proposed to use multiple amplifiers with output signals that exhibit adjustable phase differences relative to one another, in order to respectively feed separate antennas. The intensity distribution of the transmission field within the excitation volume should thus be better adapted to the requirement of the magnetic resonance. Ideally, instead of one amplifier that delivers the total power, eight individual amplifiers are then required from which only one eighth of the total transmission power must be delivered.

So that the amplifier can operate ideally, the connected load impedance must always correspond to 50 Ohm. Depending on the weight and volume of the patient to be examined, however, the antenna impedance changes, and thus the load impedance for the amplifier also changes. However, a pre-adaptation can only be implemented for a standard load case, such that in most cases a portion of the power sent to the antenna is reflected at the feed point and arrives back at the amplifier. In order to solve this problem, the following possibilities are known.

First, the reflected power can simply be allowed to transduce into heat in the amplifier, which leads to an over-dimensioning of the cooling requirement and the structural size. This is reflected in high costs of the amplifier. Additionally, the risk exists that the current and voltage peaks of the reflection power can destroy the end stage of the amplifier.

Another possibility, in which the amplifier is protected from reflected power, is to use what is known as an adaptation tuner that minimizes the reflected power for every load case before the actual measurement. In particular given use of multiple amplifiers, such a procedure has disadvantages. A much greater circuit complexity is required for the adaptation tuner and the time cost for the load compensation is greater.

Therefore it has been proposed to interpose a circulator between the amplifier and the terminal of the magnetic resonance antenna, which circulator relays the transmission power arriving from the amplifier nearly without loss to the magnetic resonance antenna while the reflected power arrives at the third output of the circulator and there is consumed in a power dump (thus a reflection-free power termination) or is converted into heat.

A circulator is a non-reciprocal radio-frequency component. In the present case a circulator with three terminals is used. An ideal circulator ensures that a signal is relayed from one terminal to another in one direction practically without attenuation and free of reflection. For example, a signal can be relayed only from terminal 1 to terminal 2, from terminal 2 to terminal 3 or from terminal 3 to terminal 1. In order to achieve this non-reciprocal transmission, microwave ferrites are used that are saturated by a strong magnetic field. The ferrite structure used (also called a resonator) is essentially formed by two generally cylindrical ferrite plates between which a conductor trace structure is enclosed. The required constant magnetic field is generated by permanent magnets arranged above and below the ferrite structure. A housing or cover often serves as a yoke to close the magnetic circuit. Magnetic field lines are in principle closed. To generate a predictable magnetic field it is typical to merge the magnetic field into a magnetic circuit through components that are particularly good conductors in order to optimally avoid scatter field losses. Via such field conductor elements, the magnetic flux can be directed in specific, desired paths.

In order to obtain an optimally ideal circulator, it is important to find the correct operating point, thus in particular to find an optimal operating field. For real circulators it is additionally known that a temperature dependency exists. Known circulators accordingly require a static magnetic operating field of specific size which is produced by permanent magnets.

In magnetic resonance apparatuses or magnetic resonance antenna devices, cable damping (i.e. losses due to cables that are too long) should be optimally minimized, such that the amplifier should be arranged in proximity to the antenna. The power demand at the amplifier is thereby distinctly lowered. For the possibility of a decoupling of the reflected power via circulators, this means that these must likewise be arranged in the region of the antenna, but when the circulators are placed at that location, the strong magnetic scatter field of the magnetic resonance apparatus alters the field that is present in the region of the ferrite structure away from the optimal operating field such that the circulator loses its function. The magnetic properties of the permanent magnets additionally suffer a lasting change due to the strong scatter field of the magnetic resonance apparatus. Placement in proximity to the magnetic resonance apparatus is not reasonable in this case.

To solve this problem it has been proposed to use a circulator without permanent magnets that utilizes the fundamental "interfering" scatter field of the magnetic resonance apparatus. For this, the circulator would have to be mounted at suitable positions in the scatter field at which orientation and size of the magnetic field coincide with the optimal operating field as was generated by the previously present, but now removed, permanent magnets. However, ultimately this solution would be practical only in rare cases since design limitations (for example the attachment, the cooling or the wiring) to arrange the circulator exactly at the matching points in the scatter field are not allowed. An additional problem is that the scatter field is not constant over time, and disruptions thus can also occur.

SUMMARY OF THE INVENTION

An object of the invention is to provide a circulator that can be used under a larger number of external scatter field conditions and therefore can be freely placed.

This object is achieved in a circulator of the aforementioned type wherein, according to the invention, a field conductor device fashioned to amplify or attenuate a specific external magnetic field and/or at least one electromagnet to generate an operating field running perpendicularly through the ferrite structure is provided instead of a permanent magnet.

According to the invention, not only is the permanent magnet omitted, but it is replaced with a field-affecting field conductor device and/or an electromagnet that can be controlled to generate a specific electromagnetic field. By these measures it is possible to correct deviations of the scatter field from the optimal operating field, and in extreme cases even to counteract the scatter field to generate the optimal operating field. Within the scope of the invention it is accordingly possibly not only to use the external magnetic field and to correspondingly shape it by means of the field conductor device and/or the at least one electromagnet, but also to completely reshape it given corresponding design of the components, such that a more functional circulator is ensured. For example, a field conductor device whose components or field conductor elements exhibit a high magnetic permeability can be used in order to amplify an external magnetic field that is too weak at the location of the ferrite structure, as well as to shield against and therefore attenuate an external magnetic field that is too strong. Direction corrections are also conceivable given corresponding design of the field conductor device. A controllable electromagnetic field can be generated by the electromagnet that is superimposed on the external magnetic field (in particular the scatter field) in the region of the ferrite structure and supports, attenuates, but also (under the circumstances) replaces or overcompensates, the existing external magnetic field. For example, in a combination of both measures the field conductor device can enable a rough adaptation and a fine correction can ensue with the electromagnet.

In this way it is possible to practically use circulators between the amplifiers and the magnetic resonance antenna so that the amplifiers can be designed for lower maximum voltages or currents. This leads to a reduction of costs, structural size and cooling capacity. By the use of the field conductor device and/or the electromagnet, the circulator can advantageously be arranged at nearly arbitrary points within the scatter field of a magnetic resonance apparatus, in particular even mounted directly on the magnet housing. Mechanical and design limit conditions that enable an actual use in the first place can thereby be satisfied.

Since a homogeneous magnetic field is required for operation of the circulator in the region of the ferrite structure, homogenization elements (in particular iron plates) for the homogenization and perpendicular alignment of the operating field in the region of the ferrite structure can be appropriately provided on the top and bottom of the ferrite structure. The homogenization elements (frequently also called pole plates) advantageously have at least the dimensions of the (in particular cylindrical) ferrite structure and consequently cover this on both sides. Since the field lines emanate perpendicularly from the material of the homogenization element, a homogeneous operating field that is in particular aligned perpendicular to the ferrite plates is ensured.

As mentioned, the field conductor device can serve to shield against the external magnetic field. For this purpose, the field conductor device can be provided with a shield housing surrounding the ferrite structure and conducting the magnetic field around said ferrite structure. The field conductor device (whose components a composed essentially of a material with a high magnetic permeability) in this case acts as a type of "bypass" since, due to the high value for the magnetic permeability of the shield housing, the field lines preferably run in the shield housing, so a reduced magnetic field is present inside the housing.

If an electromagnet is provided in addition to the field conductor device, the shield housing can at least partially form a portion of the magnetic circuit to close the field lines of the magnetic field generated by the electromagnet. The shield housing then acts in the manner of a yoke since the field lines of the magnetic field generated by the electromagnet also preferably run through the shield housing. The scatter field losses of the electromagnetic field are reduced in this way. A field conductor element forming a portion of the magnetic circuit can appropriately be provided on the side of the ferrite structure situated opposite an electromagnet and/or between the electromagnet and the shield housing. Air gaps within the housing are also closed in this way so that in particular a complete, closed circuit results. However, in the design of such an embodiment care is to be taken that a portion of the external magnetic field is conducted through the housing via the field conductor elements and the electromagnet (as well as its core, if present) in this embodiment. However, this effect can even be desired.

If, in the case of a shield housing, the shielding effect should not be impaired, or if no shield housing at all is provided, a yoke to close the field lines of the field generated by the electromagnet can be provided that, for example, acts directly at the electromagnet and on the other side at the ferrite structure or a homogenization element.

As mentioned, however, the field conductor device can also serve to amplify an external magnetic field. In an advantageous embodiment of the invention, the field conductor device can be provided with at least one (in particular at partially conically shaped) field conductor element, arranged coaxial to the ferrite structure, to amplify or attenuate the external magnetic field in the region of the ferrite structure. Due to the high permeability of the field conductor element, the field lines advantageously run within said field conductor element. If this shape new tapers toward the ferrite structure, the field lines are bundled and the field is thus amplified in the tapered part. However, it is just as easily possible that this embodiment serves to attenuate the external field if the cross section of the field conductor element expands as it proceeds toward the ferrite structure. Arbitrary operating fields can be generated for a fixed, external magnetic field via the specific shaping.

As mentioned, with the electromagnet it is possible to generate a controllable electromagnetic field so that the circulator is not optimized for a specific position (i.e. a specific external magnetic field) given use of an electromagnet; rather, a multifaceted usage capability exists. However, adaptation possibilities to different external magnetic fields, even to other types, are conceivable.

The magnetic circuit that closes the field lines of the field generated by the electromagnet or the field conductor path of the field lines of the external field in a circulator can have an air gap whose width is adjustable. As already mentioned above, an air gap leads to scatter field losses so that ultimately the strength of the operating field at the ferrite structure is adjustable via the width of the air gap. The adjustment can ensue via a corresponding, externally controlled adjustment device (driven via a motor, for example, but simple embodiments are also conceivable in which a different number of iron lamina or lamina made of other ferromagnetic materials can be introduced into the air gap.

In an additional variant for adaptation to different positions or different external magnetic fields or conditions, the circulator has a displacement device to tilt the circulator in the mounted state or a displacement device is associated with the mounted circulator. Changes to the field direction of the external magnetic field can be canceled out in this way. The circulator can be brought into various positions that can be determined according to the external magnetic field.

An external magnetic field (for example the scatter field of a magnetic resonance apparatus) is frequently subjected to fluctuations that can also have an influence on the functionality of the circulator. In a particularly advantageous embodiment of the invention it can therefore be provided that the circulator comprises a magnetic field sensor, wherein the feed of current to the electromagnet and/or the width of the air gap and/or the tilt position of the circulator can be adjusted based on the measurement values of the magnetic field sensor. For this purpose, a control device can be provided that detects the measurement values of the magnetic field sensor (which can be fashioned as a Hall probe, for example) and, in the given embodiment of the circulator, determines in which settings an optimal operating field is achieved by the ferrite structure. Such a control device can then correspondingly control the different components (the electromagnet and/or the adjustment device and/or the positioning device).

Not only does a variation of the external magnetic field have an effect on the capacity of the circulator, but also the optimal operating field depends on the temperature in the region of the ferrite structure. In a further embodiment, the circulator therefore has a temperature sensor, and the feed of current to the electromagnet and/or the width of the air gap can be adjusted based on the measurement values. For example, such a temperature sensor can be arranged as a pad directly at the ferrite structure. Temperature changes arise not only through the environment but also, for example, via the operation of the electromagnet. Here as well a control device can be provided that reads out the temperature sensor and in which a mathematical relation or value table is stored that sets the measured temperature in relation to an optimal operating field. The adjustment of the devices affective the magnitude of the operating field can then correspondingly ensue.

It is particularly appropriate when a magnetic field sensor and a temperature sensor are provided with which a common control device is associated that activates the corresponding devices of the circulator. As optimal an operating field as is possible is then always ensured under the various conditions.

As mentioned, the operation of the electromagnet (that should be designed to be sufficiently strong) generates heat. Therefore the circulator can be provided with a cooling device for liquid cooling and/or radiant cooling and/or as a heat exchanger. A cooling element of the cooling device can be arranged, for example, on the side of the ferrite structure opposite the electromagnet, for example a cooling block through which water flows. If this is additionally designed as a field conductor element, it fulfills a dual function: as a cooling element and as a field conductor element of a magnetic circuit or in the field conduction path of the field lines of the external magnetic field.

It is not necessary to be limited only to one electromagnet. For example, two (in particular identical) electromagnets can be provided on opposite sides of the ferrite structure, analogous to the known embodiment with one permanent magnet on each side of the ferrite structure given a conventional circulator. Such a symmetrical arrangement simplifies the adjustment of the optimal operating field, in particular with regard to its homogeneity as well.

For example, the electromagnet can have a coil in the range from 80-120 mH. Fields in the range from multiple hundreds of mT still exist even in the border regions in a scatter field (for example of a magnetic resonance apparatus), for example. If a suitably high current is applied, a scatter field at this level can be sufficiently attenuated or even compensated or over-compensated with such a coil.

In order to further strengthen the effect of the electromagnet, the electromagnet can have a core. In particular, such a core can be extended over the length of the coil in order to contact other field conductor elements, for example.

In addition to the circulator, the invention also concerns a magnetic resonance antenna device for a magnetic resonance apparatus that includes a magnetic resonance antenna with at least one terminal and at least one amplifier associated with a terminal to activate the magnetic resonance antenna. The magnetic resonance antenna device has a circulator according to the invention that is interconnected between the amplifier and the terminal so that power reflected from the magnetic resonance antenna can be discharged into a power dump connected with the circulator. All embodiments of the circulator according to the invention that have been described in the preceding can be realized in such a magnetic resonance antenna device. In particular, the magnetic resonance antenna device can have a displacement device coupled in terms of movement with the circulator to tilt said circulator. In this case the displacement device does not form part of the circulator but rather is associated with it. If multiple amplifiers for different antenna elements are provided, a circulator can naturally be associated with each of these amplifiers and antenna elements.

The invention also concerns a magnetic resonance apparatus that has a magnetic resonance antenna device according to the present invention. Via the use of the circulator according to the invention in a magnetic resonance apparatus, a greater freedom is provided in the arrangement of the circulator, which provides corresponding freedom as to the mechanical and design limit conditions.

BRIEF DESCRIPTION OF THE DRAWINGS

FIG. 1 is a circuit diagram of a magnetic resonance antenna device according to the invention.

FIG. 2 shows a first exemplary embodiment of a circulator according to the invention in cross section.

DESCRIPTION OF THE PREFERRED EMBODIMENTS

Figure 3:
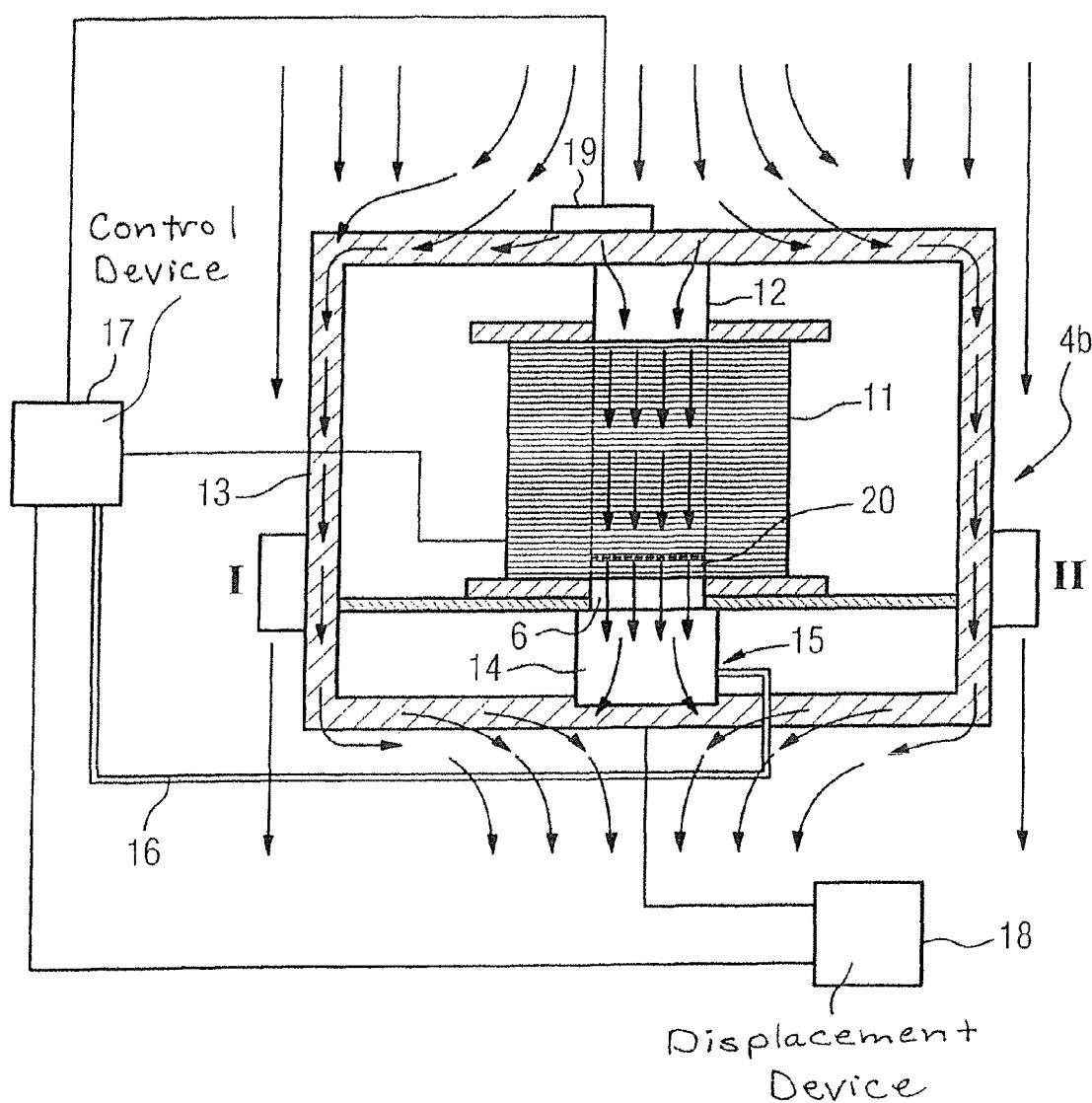
FIG. 3 shows a second exemplary embodiment of a circulator according to the invention, in cross-section, wherein the associated activation is only schematically represented.

FIG. 1 shows the circuit diagram of a magnetic resonance antenna device 1 according to the invention. It has an amplifier 2 to amplify the transmission signals to be emitted by a magnetic resonance antenna 3. A circulator 4 according to the invention and that has three terminals I, II and III is connected between the amplifier 2 and the magnetic resonance antenna 3. If the correct operating field is present at the ferrite structure of the circulator 4 (not shown in detail here), signals are relayed from the terminal I to the terminal II, from the terminal II to the terminal III and from the terminal III to the terminal I, as indicated by the arrow. In this way power reflected from the magnetic resonance antenna 3 is essentially entirely fed via the terminal III to a power dump 5, thus a reflection-free terminator. The amplifier 2 therefore does not need to be over-dimensioned.

The circulator 4 should be suitable to be operated in the external magnetic field of a magnetic resonance apparatus, so an optimally wide selection of positioning possibilities should be available. Various embodiments of the circulator 4 are presented with reference to FIGS. 2 through 4.

FIG. 2 shows a first embodiment of a circulator 4a in cross section. It comprises a ferrite structure 6 that is covered on both sides by iron plates 7 that serve as homogenization elements and generate between them a homogeneous magnetic field aligned perpendicular to the ferrite structure 6.

Due to the cross section view, only the terminals I and II are visible. The circulator 4a is arranged in an external magnetic field that in this case is too weak to serve as an operating field for the ferrite structure 6. Therefore a field conductor device is provided that has a field conductor element 8 tapering conically toward the ferrite structure 6. This causes the field lines to be compressed toward the ferrite structure 6 (as shown by the arrows representing the field curve) so that a stronger field exists there that can serve as an operating field for the ferrite structure 6. The field is relayed outward again by means of an additional field conductor element 9 that is arranged on the side opposite the field conductor element 8. A non-magnetic housing 10 is provided to stabilize the circulator 4a. With a simple design it is accordingly possible to shape the external magnetic field so that it can be used as an operating field for the ferrite structure 6. Moreover, it is noted that the circulator 4a can also be slightly angled relative to the external field since—due to the limit conditions—the field lines always enter into the field conductor element 8 perpendicularly, such that the angle is corrected again. Given varying orientations of the external field, a displacement device can also be provided by means of which the circulator 4a can be pivoted. This is not shown in detail here.

The field conductor elements 8 and 9 are composed of a material with optimally high magnetic permeability in order to conduct the field as optimally as possible.

A second embodiment of the present invention is shown in FIG. 3. Components of the circulator 4b that coincide with those of the first exemplary embodiment are designated with the same reference characters. A ferrite structure 6 is again provided that, in this case however, is not enclosed by iron plates, although this would also be possible here. The circulator 4b comprises an electromagnet 11 that is geometrically dimensioned so that it can be placed precisely on the ferrite structure 6 with its central passage opening. An optimally direct connection of the ferrite structure 6 to a core 12 of the electromagnet 11 can be realized in this way. The core 12 is extended so that it is in contact with the shield housing 13 that completely surrounds the arrangement. The shield housing 13 is part of the field conductor device and also it serves as a yoke to close the field lines of the field generated by the electromagnet 11. When completely closed, this magnetic circuit is by a cooling element 14 arranged on the opposite side of the ferrite structure 6 in relation to the electromagnet 11, which cooling element 14 is designed so that it also serves as a field conductor element.

As mentioned, the shield housing 13 is part of the field conductor device. A good portion of the field lines of the external field are conducted by this around the inside of the shield housing 13, as is again indicated by the arrows. Another portion of the field lines of the external field traverse the inside of the shield housing 13 across the core 12, the ferrite structure 6 and the cooling element 14. The field conductor device (comprising the shield housing 13, the core 12 and the cooling element 14) is now designed so that the external magnetic field is attenuated such that it can essentially serve as an operating field for the ferrite structure 6. In order to generate an optimal operating field, the electromagnet 11 is correspondingly fed with current.

The cooling element 14 belongs to a cooling device 15 fashioned as a water cooler that is provided in order to counteract the heat development due to the electromagnet 11. Water supplied via the feed and discharge line 16 is conducted through channels provided inside the cooling element 14. The activation of the cooling device 15 ensues by means of a control device 17 via which the electromagnet 11 and a displacement device (indicated at 18 only for clarity) with whose help the circulator 4b can be tilted are also activated.

According to everything stated in the preceding, given a fixed current feed to the electromagnet 11 the magnetic field present in the ferrite structure 6 is dependent on the strength and possibly orientation of the external magnetic field. However, at the same time it applies that the optimal operating field is dependent on the temperature of the ferrite structure 6. However, the circulator 4b is fashioned to react dynamically to such variations of the operating conditions and thus to achieve an optimal operating field (and thus an optimal functionality) of the circulator at any time. For this purpose, the circulator 4b comprises a magnetic field sensor 19 arranged in the shield housing 13 in the form of a Hall probe with which the external magnetic field can be measured. Furthermore, a temperature sensor 20 is provided between the core 12 and the ferrite structure 6, thus directly adjoining the ferrite structure 6. Both the magnetic field sensor 19 and the temperature sensor 20 deliver their measurement data to the control device 17 where, using the data about the external magnetic field, it is checked whether the optimal operating field required based on the temperature measurement data is still maintained given the current operating conditions. If that is not the case, the control device is fashioned to activate the electromagnet 11 and the displacement device 18 so that an optimal operating field is again present in the ferrite structure 6.

Not shown in detail in FIG. 3 is an additional possibility to adjust the magnetic field in the ferrite structure 6 that can also be used in the first exemplary embodiment. An adjustable air gap can thus be provided in the magnetic circuit or, respectively, on the path of the field lines of the external field. For example, it would be conceivable to detach the upper part of the core 12 and to direct it through the shield housing 13 so that its distance from the lower part of the core 12 can be varied. An adjustment device that can also be controlled by the control device 17 can be provided for this. An additional degree of freedom for the adjustment of the field results in this way since scatter field losses occur due to the air gap. This means that the greater the air gap, the smaller the field at the ferrite structure 6.

The control device 17 does not have to be arranged outside of the circulator 4b, as shown here; rather, it can naturally also be advantageously integrated into this. The positions of the sensors can also be selected differently.

Figure 4:
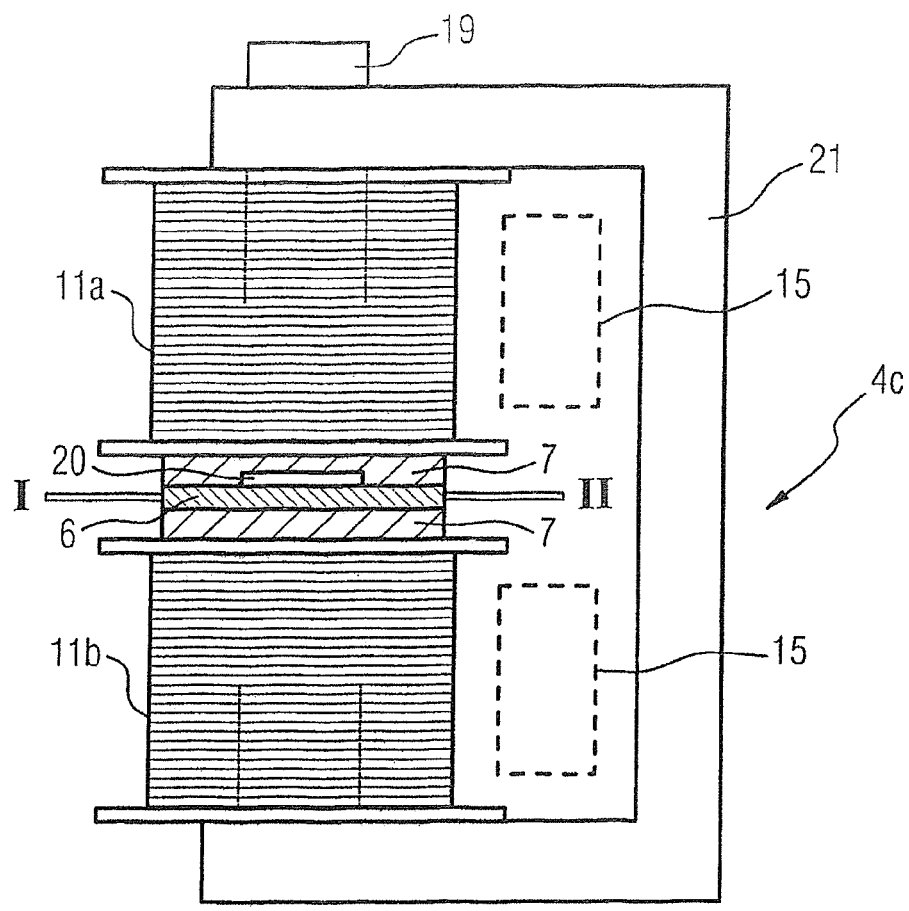
FIG. 4 shows a third exemplary embodiment of a circulator according to the invention, in cross-section.

FIG. 4 shows a third exemplary embodiment of a circulator 4c according to the invention, wherein here the activation electronics and the magnetic field are not shown for clarity. A ferrite structure 6 is arranged between two iron plates 7 as homogenization elements. Respectively arranged on opposite sides of the ferrite structure 6 is an electromagnet 11a, 11b, wherein the electromagnets 11a and 11b are coils of identical design. The magnetic circuit is closed by a yoke 21. A temperature sensor 20 and a magnetic field sensor 19 are also provided in turn in this case.

Naturally, a shield housing can also additionally be provided at the circulator 4c so that ultimately less field penetrates inside and the operating field is essentially determined by the electromagnets 11a and 11b. Other field conductor elements can also be used. Additionally, it is also reasonable here to provide a cooling device 15 (which is only indicated in FIG. 4, however).

Additional adjustment possibilities can also be realized in the circulator 4c. For example, the yoke 21 can be adjusted in terms of its height so that an air gap can be formed in the magnetic circuit. A displacement device to tilt the circulator 4c can also be associated with said circulator 4c, or this can possess such a displacement device.

The electromagnets 11, 11a and 11b each can be fashioned as coils. If the circulator 4 is provided for use in a magnetic resonance apparatus, for the most part fields in the range of multiple tens or multiple hundreds of mT are used. For comparison: the optimal operating field of a ferrite structure 6 can be approximately 47 mT at 30° C., for example, approximately 40 mT at 70° C. For an operation under such conditions the coils can exhibit inductances of 80 to 120 mH, for example.

Figure 5:
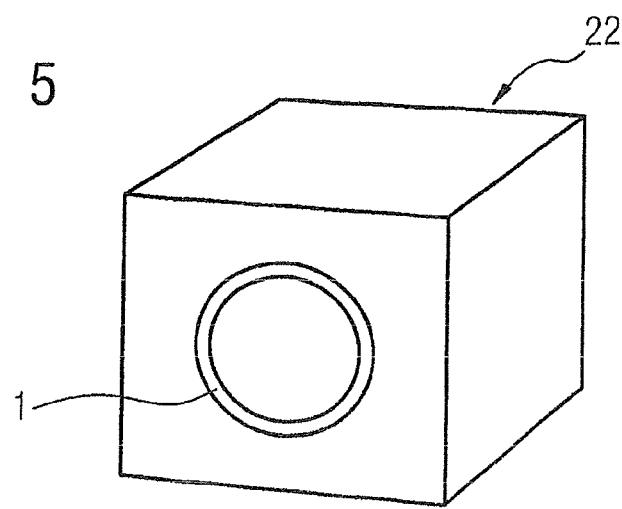
FIG. 5 shows a magnetic resonance apparatus according to the invention.

FIG. 5 shows a magnetic resonance apparatus 22 according to the invention that has a magnetic resonance antenna device 1 according to the present invention.

Although modifications and changes may be suggested by those skilled in the art, it is the intention of the inventors to embody within the patent warranted heron all changes and modifications as reasonably and properly come within the scope of their contribution to the art.

We claim as our invention:

1. A circulator for use in an external magnetic field of a magnetic resonance apparatus, comprising:
    a flat ferrite structure comprising a first terminal adapted for connection to an amplifier and a second terminal adapted for connection to an antenna, said ferrite structure being configured to interact with an operating field, and when said operating field is optimum, to relay reflection-free signals from said amplifier to said antenna; and
    a field conductor device that amplifiers or attenuates said external magnetic field, said field conductor device being located relative to said flat ferrite structure generating said operating field, from said external magnetic field, so as to proceed perpendicularly through said ferrite structure, said field conductor device comprising no permanent magnet and being configured to interact with said external magnetic field at any arbitrary location within said external magnetic field to make said operating field optimum for said ferrite structure.

2. A circulator as claimed in claim 1 comprising homogenization elements located at a top and bottom of said ferrite structure that homogenize and perpendicularly align said operating field in said ferrite structure.

3. A circulator as claimed in claim 1 comprising a shield housing that surrounds said ferrite structure and conducts said external magnetic field around said ferrite structure.

4. A circulator as claimed in claim 1 wherein said field conductor device comprises at least one field conductor element located coaxially relative to said ferrite structure that amplifies or attenuates said external magnetic field in said ferrite structure, said field conductor element being at least partially conically shaped.

5. A circulator as claimed in claim 1 comprising a magnetic circuit that closes field lines of a magnetic field generated by said field conductor device within an air gap, and wherein a width of said air gap is adjustable.

6. A circulator as claimed in claim 5 comprising a magnetic field sensor that measures said external magnetic field and generates a sensor output signal corresponding thereto, and wherein said magnetic circuit is supplied with said sensor output signal and adjusts the width of said air gap dependent on said sensor output signal.

7. A circulator as claimed in claim 5 comprising a temperature sensor that senses a temperature of an environment in which said ferrite structure is located, and generates a sensor output signal corresponding thereto, said magnetic circuit being supplied with said sensor output signal and adjusting the width of said air gap dependent thereon.

8. A circulator as claimed in claim 1 comprising a displacement device that tilts said ferrite structure relative to said external magnetic field.

9. A circulator as claimed in claim 8 comprising a magnetic field sensor that measures said external magnetic field and generates a sensor output signal corresponding thereto, said sensor output signal being supplied to said displacement device and said displacement device controlling tilting of said ferrite structure dependent on said sensor output signal.

10. A circulator as claimed in claim 8 comprising a temperature sensor that senses a temperature of an environment in which said ferrite structure is located, and that generates a sensor output signal corresponding thereto, said sensor output signal being supplied to said displacement device and said displacement device controlling tilting of said ferrite structure dependent thereon.

11. A circulator as claimed in claim 1 comprising a cooling device that cools said ferrite structure, said cooling device being selected from the group consisting of liquid cooling devices, radiant cooling devices, and heat exchangers.

12. A magnetic resonance antenna device for a magnetic resonance apparatus that produces an external magnetic field during operation thereof, said antenna device comprising:
    an antenna configured to transmit radio-frequency signals or receive magnetic resonance signals, said antenna comprising at least one antenna terminal;
    an amplifier that generates signals for supply to said at least one antenna terminal configured to activate said antenna;
    a circulator connected between said amplifier and said at least one antenna terminal that discharges power reflected by said antenna into a power dump connected to the circulator; and
    said circulator comprising a flat ferrite structure comprising a first terminal adapted for connection to an amplifier and a second terminal adapted for connection to an antenna, said ferrite structure being configured to interact with an operating field, and when said operating field is optimum, to relay reflection-free signals from said amplifier to said antenna, and a field conductor device that amplifiers or attenuates said external magnetic field, said field conductor device being located relative to said flat ferrite structure and generating said operating field, from said external magnetic field, so as to proceed perpendicularly through said ferrite structure, said field conductor device comprising no permanent magnet and being configured to interact with said external magnetic field at any arbitrary location within said external magnetic field to make said operating field optimum for said ferrite structure.

13. A magnetic resonance antenna device as claimed in claim 12 comprising a displacement device that mechanically tilts said circulator relative to said external magnetic field.

14. A magnetic resonance apparatus comprising:
    a magnetic resonance data acquisition device comprising an antenna that radiates radio-frequency signals or receives magnetic resonance signals, said antenna having at least one antenna terminal, said magnetic resonance data acquisition device producing an external magnetic field during operation thereof;
    an amplifier that generates signals for supply to said at least one antenna terminal configured to activate said antenna;

a circulator connected between said amplifier and said at least one antenna terminal that discharges power reflected by said antenna into a power dump connected to the circulator; and said circulator comprising a flat ferrite structure comprising a first terminal adapted for connection to an amplifier and a second terminal adapted for connection to an antenna, said ferrite structure being configured to interact with an operating field, and when said operating field is optimum, to relay reflection-free signals from said amplifier to said antenna, and a field conductor device that amplifiers or attenuates said external magnetic field, said field conductor device being located relative to said flat ferrite structure and generating said an operating field, from said external magnetic field, so as to proceed perpendicularly through said ferrite structure, said field conductor device comprising no permanent magnet and being configured to interact with said external magnetic field at any arbitrary location within said external magnetic field to make said operating field optimum for said ferrite structure.

\* \* \* \* \*